US008112686B2

(12) United States Patent
Hapke et al.

(10) Patent No.: US 8,112,686 B2
(45) Date of Patent: Feb. 7, 2012

(54) DETERMINISTIC LOGIC BUILT-IN SELF-TEST STIMULI GENERATION

(75) Inventors: Friedrich Hapke, Winsen (DE);
Michael Wittke, Pinneberg (DE);
Reinhard Meier, Buxtehude (DE)

(73) Assignee: Mentor Graphics Corporation, Wilsonville, OR (US)

( * ) Notice: Subject to any disclaimer, the term of this patent is extended or adjusted under 35 U.S.C. 154(b) by 34 days.

(21) Appl. No.: 12/629,038

(22) Filed: Dec. 1, 2009

(65) Prior Publication Data

US 2010/0275075 A1     Oct. 28, 2010

Related U.S. Application Data

(60) Provisional application No. 61/119,016, filed on Dec. 1, 2008.

(51) Int. Cl.
*G01R 31/28*     (2006.01)
(52) U.S. Cl. .................... 714/733; 714/726; 714/738
(58) Field of Classification Search .................. 341/150; 714/732, 728, 729, 733, 726, 738
See application file for complete search history.

(56) References Cited

U.S. PATENT DOCUMENTS

| 5,691,990 A * | 11/1997 | Kapur et al. ............... 714/726 |
| 6,789,221 B2 | 9/2004 | Hapke |
| 7,143,324 B2 * | 11/2006 | Bratt et al. ................ 714/726 |
| 7,284,176 B2 * | 10/2007 | Wang et al. ............... 714/738 |
| 7,302,624 B2 * | 11/2007 | Rajski et al. .............. 714/732 |
| 7,376,873 B2 | 5/2008 | Vranken et al. |
| 7,486,205 B2 * | 2/2009 | Wegener .................... 341/50 |
| 7,555,688 B2 * | 6/2009 | Alvamani et al. .......... 714/729 |
| 7,840,865 B2 * | 11/2010 | Lai et al. .................... 714/728 |
| 7,945,833 B1 * | 5/2011 | Wang et al. ................ 714/729 |
| 2010/0117658 A1 | 5/2010 | Hapke et al. |

FOREIGN PATENT DOCUMENTS

WO    WO 2008/078229     7/2008

* cited by examiner

*Primary Examiner* — David Ton

(57) ABSTRACT

Techniques for storing and using compressed restrict values for selected scan chains and flip-flops, such that the states that need to be applied to those flip flops need not be solved by a linear equation system solver, such as a linear equation system solver provided by an automatic test pattern generation (ATPG) tool. Selected restrict values can then be injected into test patterns for those flip-flop combinations that need to be set in a certain shift cycle or those flip-flops that need to be initialized one after another (e.g., for serial settings in one scan chain).

16 Claims, 4 Drawing Sheets

DETERMINISTIC LOGIC BUILT-IN SELF-TEST STIMULI GENERATION

RELATED APPLICATIONS

This application claims priority to U.S. Provisional Patent Application No. 61/119,016, entitled "Deterministic Logic Built-In Self-Test Stimuli Generation," filed on Dec. 1, 2008, and naming Friedrich Hapke et al. as inventors, which application is incorporated entirely herein by reference.

FIELD OF THE INVENTION

The present invention is directed to the generation of deterministic test patterns for a built-in self-test of an integrated circuit device. Various embodiments of the invention may be particularly useful for providing values of a deterministic pattern to specific scan chains or to specific flip-flops in one or more scan chains of an embedded deterministic test system.

BACKGROUND OF THE INVENTION

As integrated circuits continue to develop, they continue to have higher device densities and clocking rates. As a result, it requires ever-increasing numbers of test vectors to properly test them, which in turn requires larger and larger amounts of tester vector memory. Still further, manufacturing newer integrated circuits requires even more complex manufacturing techniques, with the corresponding increase in problems and costs related to the production of integrated circuits. To address these problems, and to allow for a self-test of integrated circuits in the field, a testing technique referred to as "built-in self-test" (BIST) is expected to be used more and more in the future.

With logic built-in self-test (LBIST), test circuits for testing the functional logic of an integrated circuit are added to the circuit's design. FIG. 1 illustrates the general configuration of an integrated circuit using LBIST. As seen in this figure, an integrated circuit 101 includes a test stimulus generator 103, a circuit-under-test (CUT) 105, and a test response evaluator 107. The integrated circuit 101 also includes a test control module 109, for controlling the operation of the test stimulus generator 103, the circuit-under-test (CUT) 105, and the test response evaluator 107. With this arrangement, the test stimulus generator 103 generates test stimuli that are applied to the circuit-under-test 105 through scan chains. The scan chains may be, for example, flip-flops in the circuit-under-test 105 that can be configured into serial shift registers during a test mode.

The self-test is performed by repeatedly shifting the generated test stimuli into the scan chains so that they are applied to the circuit-under-test 105, and operating the circuit-under-test 105 for a number of clock cycles in its functional application mode. Various techniques for generating efficient stimuli are well-known in the art. The responses produced by the circuit-under-test 105 are captured by the scan chains, and relayed to the test response evaluator 107 where, for example, they are compacted on-chip using a compacting device, such as a multiple input shift register (MISR), to produce a compacted test signature. The compacted test signature can then be compared against a corresponding fault-free signature to determine if the integrated circuit has any of the faults tested for by the test stimuli. Depending upon the implementation, the compacted test signature can be compared with the fault-free signature on-chip, or after it has been exported off of the integrated circuit for comparison by, for example, automated test equipment.

As previously noted, various techniques for generating efficient stimuli are well-known in the art. These include, for example, techniques for generating test stimuli for built-in self-test applications that improve the random testability of the circuit by state-of-the-art test points insertion (TPI), by a linear feedback shift register (LFSR) reseeding, by Bit-Flipping-Logic (see, for example, U.S. Pat. No. 6,789,221, issued Sep. 7, 2004, which patent is incorporated entirely herein by reference), or by a cycle-based stimuli generation (see, for example, European Patent Application No. 06126627.6, filed on Dec. 20, 2006, which application is incorporated entirely herein by reference as well). In the case of reseeding a linear feedback shift register (LFSR), which is typically coupled with a phase shifter (PS), the test stimuli are derived from the LFSR seeds that are stored in, for example, a memory circuit, such as a read-only memory (ROM) circuit. With Bit Flipping Logic or cycle based stimuli generation, stimuli patterns generated using the LFSR/PS combination can be optimized to cover difficult-to-test faults.

Modern integrated circuits contain a large (e.g., multiple millions) number of flip-flops, however. When using the reseeding feature of a LFSR, it is often not possible to solve the set of linear equations required to get the correct states at the flip-flops, because only very few bits can be stored as the LFSR seed in the memory circuit. Further, the use of Bit Flipping Logic introduces a significant problem in the design flow, while the use of cycle based stimuli generation often is not feasible with modern integrated circuits because of the amount of data that needs to be stored on chip, e.g. in a ROM, becomes unacceptably large. Still further, the number of scan chains in typical modern integrated circuit designs can be very large as well, and can easily be in the range of 1000 to 5000 scan chains. Storing a complete stimuli pattern for such a large number of scan chains with cycle based stimuli generation also would require a prohibitively large memory circuit, and would slow down the test frequency as well.

BRIEF SUMMARY OF THE INVENTION

Aspects of the invention relate to techniques for storing and using compressed restrict values for selected scan chains and flip-flops, such that the states that need to be applied to those flip flops need not be solved by a linear equation system solver, such as a linear equation system solver provided by an automatic test pattern generation (ATPG) tool. Storing only compressed and selected restrict values reduces the on-chip storage requirements significantly, so that all of the needed compressed stimuli values to provide high fault coverage can be stored in an on-chip ROM. With selected restrict values according to various embodiments of the invention, only the flip-flop values for those flip-flops that are required in many test patterns or those flip-flop combinations that are difficult to set all in one pattern are stored. These are typically multiple flip-flops that need to be set in a certain shift cycle or those flip-flops that need to be initialized one after another (e.g., for serial settings in one scan chain).

Various implementations of the invention can efficiently store and provide a variety of flip-flop-related data including, e.g., compressed parallel data that is needed in one shift cycle, serial scan chain data, and also compressed LFSR seeds. All together, these three data categories can lead to a higher probability for a successful solution of a linear equations system and consequently to higher fault coverage, while significantly reducing the overall size of a memory circuit that conventionally would be used to store conventionally-used LFSR seeds, thus saving area and test costs.

DETAILED DESCRIPTION OF THE INVENTION

Built-in Self-Test System

Figure 1:
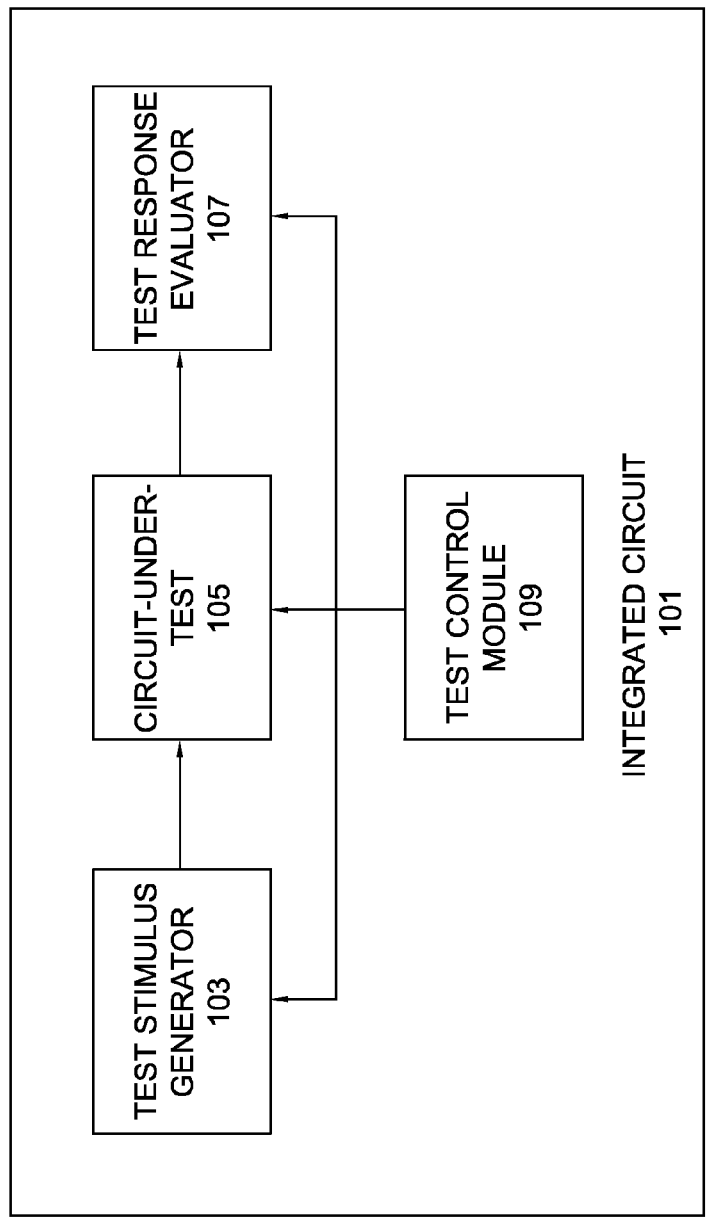
FIG. 1 illustrates the general configuration of an integrated circuit using LBIST.
Figure 2:
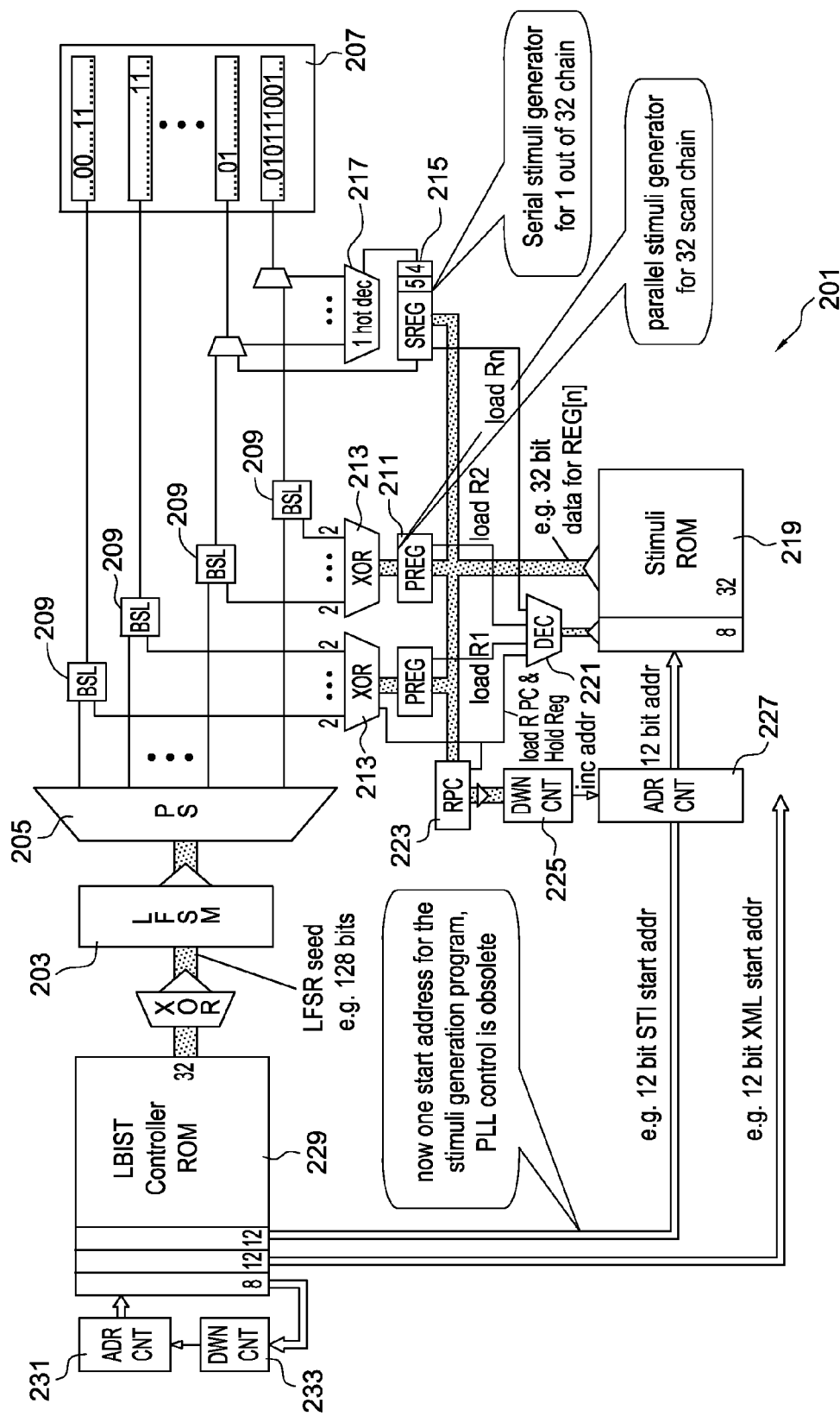
FIG. 2 illustrates an Embedded Deterministic Test (EDT) configuration that may be employed with various implementations of the invention.

FIG. 2 shows an example of an Embedded Deterministic Test (EDT) configuration 201 that may be employed with various implementations of the invention. As seen in this figure, the EDT configuration 201 includes a linear finite state machine (LFSM) 203 together with a phase shifter (PS) 205 connected to the linear finite state machine 203. According to various embodiments of the invention, stimuli generation logic is placed between the outputs of the phase shifter 205 and the inputs of internal scan chains 207. This stimuli generation logic may include bit-setting logic (BSL) devices 209, one or more parallel data registers (PREG) 211 with corresponding XOR decompressors 213, and one or more serial data registers (SREG) 215 with corresponding 1-hot decoders 217. Further, with some implementations of the invention, the stimuli generation logic also may include a stimuli memory circuit device 219 (which may be, e.g., a read-only memory (ROM) device), a register decoder (DEC) 221, a repeat counter register (RPC) 223, a down counter (DWN CNT) 225, and an address counter (ADR CNT) 227. As also seen in this figure, a BIST controller 229 with another address counter (ADR CNT) 231 and another down counter (DWN CNT) 233 can be used to provide a deterministic ATPG pattern-dependant compressed LFSM seed to the linear finite state machine 203, and a start address for the stimuli memory circuit device 219.

At the beginning of a built-in self-test process, the address counter 231 for the BIST controller 229 is reset. In response, the BIST controller 229 provides a first "Start" address to the address counter 227 of the stimuli memory circuit device 219. The effect of this will be that the stimuli memory circuit device 219 will output a number, e.g. an 8 bit register number, to the register decoder 221 for decoding. As seen from the figure, the resulting output of the register decoder 221 will select one or more of the parallel data registers 211, the serial data registers 215 and the repeat counter register 223. The stimuli memory circuit device 219 will also output a data word (e.g., a 32 bit data word) that will be loaded into the selected register (or registers). Next, the address counter 227 of the stimuli memory circuit device 219 is incremented, and as such another selected register or registers (i.e., parallel data registers 211, serial data registers 215 and/or the repeat counter register 223) will be loaded with data from the stimuli memory circuit device 219.

This process is repeated until the repeat counter register 223 is loaded with data from the stimuli memory circuit device 219. Loading the repeat counter register 223 also instructs the repeat counter register 223 to load the data from the repeat counter register 223 into the down counter 225, and to stop the address incrementation of the address counter 227 until the down counter 225 has reached its zero state. During this time, no further registers are loaded, and the system operates in shift mode for the specified number of cycles (i.e., the value stored in the repeat counter register 223). During this time, either random data from the linear finite state machine 203/phase shifter 205 combination is shifted into the scan chains 207, or deterministic parallel or serial data provided by the parallel data registers 211 or the serial data registers 215 registers is shifted into the scan chains 207. The values from the registers, which are injected into the test pattern generated by the linear finite state machine 203/phase shifter 205 combination via the bit-setting logic (BSL) devices 209, are referred to herein as restrict values. With various examples of the invention, each of the registers 211, 215 will only target a subset of the complete scan chains, e.g., 32 scan chains. Using this arrangement, it is possible to provide the desired deterministic stimuli specifically for difficult-to-test portions of the design, while the rest of the design can receives the random stimuli data that is conventionally generated by the linear finite state machine 203.

With various examples of the invention, an ATPG tool can be used to calculate the required data that needs to be loaded into the parallel data registers 211 and the serial data registers 215, so that fully deterministic test patterns will be generated on-chip. The BIST controller 229 can create a new start address for the stimuli memory circuit device 219 for each pattern determined by the ATPG tool, or the BIST controller 229 can continue to create random patterns via the linear finite state machine 203 using the same start address for the stimuli memory circuit device 219. This arrangement allows, for example, control of the clocks in multi-clock systems and permits the linear finite state machine 203 to generate pseudo-random patterns from a given linear finite state machine 203 start seed.

With various examples of the invention, each data word provided by the stimuli memory circuit device 219 may have two fields: a register field, which allows it to address a particular register (i.e., a parallel data register 211, a serial data register 215, or that repeat counter register 223) or all of the registers when a register number 0 is provided, and a data field. The data word may provide 8 bits for the register number, and 32 bits for the data field. Of course, while the number of bits needed for addressing the various registers will typically be 8, various implementations of the invention can provide more or less bits for addressing the registers, if needed.

Figure 3:
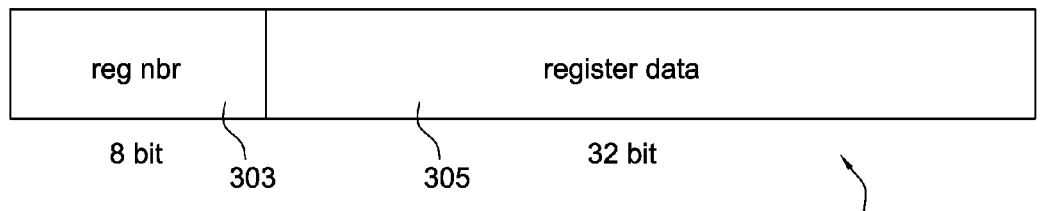
FIG. 3 illustrates an example of a data word format that can be employed to access parallel data registers according to various implementations of the invention.
Figure 4:
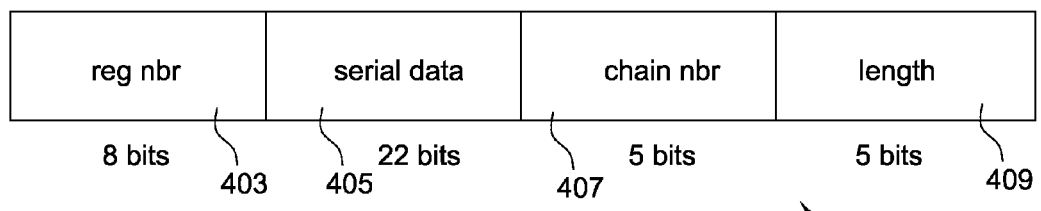
FIG. 4 illustrates an example of a data word format that can be employed to access a serial data register according to various implementations of the invention.
Figure 5:
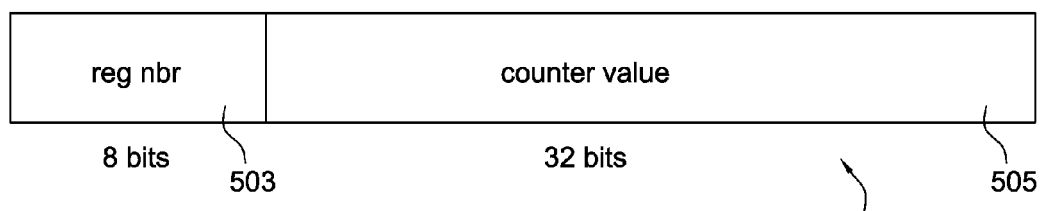
FIG. 5 illustrates an example of a data word format that can be employed to access the repeat counter register according to various implementations of the invention.

FIG. 3, for example, illustrates an example of a data word format that can be employed to access a parallel data register 211 according to various implementations of the invention. As seen in this figure, each data word 301 of the stimuli memory circuit device 219 is separated into 2 or more bit/data fields: the register field 303, and the register data 305. FIG. 4 then illustrates an example of a data word format that can be employed to access a serial data register 215 according to various implementations of the invention. As seen in this figure, the data word 401 provided by the stimuli memory circuit device 219 may be divided into, for example, 4 portions: a register number 403, the serial data 405, the chain selector 507, and the length of the serial bit stream 409. FIG.

5 illustrates an example of a data word format that can be employed to access the repeat counter register 223 according to various implementations of the invention. As seen in this figure, the data word 501 employed by the stimuli memory circuit device 219 may include 2 portions: a register number 503 and a data portion 505. Each word 501 can, for example, have 8 bits for the register number 503 as previously noted, and 32 bits for the counter value 505.

Table 1 describes a possible content of a stimuli memory circuit device 219 according to various embodiments of the invention, along with the related hardware activities initiated by that content.

TABLE 1

Example contents of a stimuli memory circuit device

Stimuli ROM

| address | reg nbr [8 bits] | data [32 bits] | hardware activities |
|---|---|---|---|
| 1 | 00 | 00 00 00 00 | load data into Parralel Data Reg# 00 i.e. all registers |
| 2 | 04 | FF FF FD 55 | load data into Parralel Data Reg# 04 |
| 3 | 03 | FF 0F A0 E2 | load data into Parralel Data Reg# 03 |
| 4 | 02 | FF FF FF B1 | load data into Parralel Data Reg# 02 |
| 5 | FF | 00 00 00 08 | load Repeat Counter Register → apply 08 shift clocks |
| 6 | 11 | AA AF F0 24 | load data into Parralel Data Reg# 11 |
| 7 | 09 | 00 00 0F E3 | load data into Parralel Data Reg# 09 |
| 8 | FF | 00 00 00 07 | load Repeat Counter Register → apply 07 shift clocks |
| 9 | 05 | 00 00 25 AB | load data into Parralel Data Reg# 05 |
| A | 06 | 11 00 FF 0E | load data into Serial Data Reg# 06 |
| B | FF | 00 00 00 12 | load Repeat Counter Register → apply 12 shift clocks |
| C | 07 | FF 0F 55 42 | load data into Parralel Data Reg# 07 |
| D | 10 | 00 AA 55 00 | load data into Parralel Data Reg# 10 |
| E | FF | 00 00 00 01 | load Repeat Counter Register → apply 01 shift clocks |
| F | 01 | FF FF FF 24 | load data into Parralel Data Reg# 01 |
| 10 | 03 | 01 00 FF E7 | load data into Parralel Data Reg# 03 |
| 11 | 02 | 0A 0A 0F B2 | load data into Parralel Data Reg# 02 |
| 12 | 06 | 00 00 00 C4 | load data into Serial Data Reg# 06 |
| 13 | FF | 00 00 00 21 | load Repeat Counter Register → apply 21 shift clocks |

Figure 6:
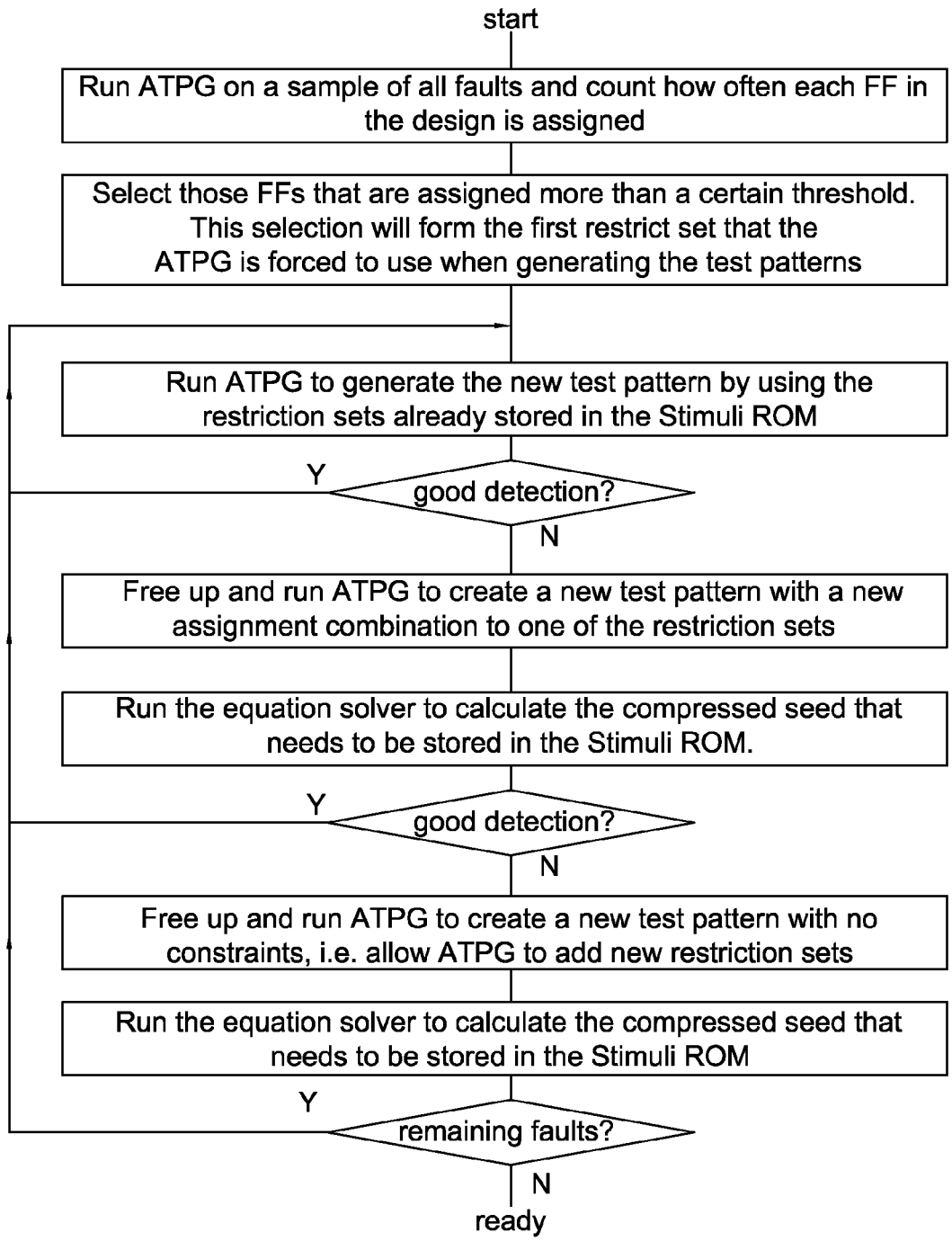
FIG. 6 illustrates a flow diagram describing an algorithm for calculating the contents of the stimuli memory circuit device according to various embodiments of the invention.

FIG. 6 illustrates a flow diagram describing an algorithm for calculating the contents of the stimuli memory circuit device 219 according to various embodiments of the invention, so that the contents of the stimuli memory circuit device 219 will drive the hardware components to create the needed deterministic stimuli to reach a very high fault coverage.

As will be appreciated from the foregoing description, a stimuli generation logic configuration according to various embodiments of the invention can provide an effective, flexible, and cheap solution for generating deterministic test patterns on-chip, such that a logic built-in self-test can be executed in production, during wafer and final test, but also when the chip is placed into the application system in the field. Various embodiments of the invention can re-use the stimuli generation hardware of a conventional EDT logic arrangement (e.g., a linear finite state machine and a phase shifter) so that the chip manufacturer can decide when to run the chip in test compression mode and when in a logic BIST mode according to various embodiments of the invention.

Further, with various implementations of the invention, no test points need to be inserted into the circuit-under-test, because random resistive faults will not matter in view of the deterministic patterns that may be generated according to embodiments of the invention. As a result, the design flow can become very simple, so that the RTL code for the logic BIST circuitry according to various embodiments of the invention can be created very early in the design phase and the needed hardware is no longer dependent on the circuit-under-test logic. The designer can implement a design as desired, while still achieving a high fault coverage. Still further, various embodiments of the invention allow the design of the circuit-under-test to be changed up to the final end of the design flow, as the ATPG tool employed with logic BIST circuitry according to various embodiments of the invention will only have to create new data to be loaded into the stimuli memory circuit device 219 to compensate for a design change to the circuit-under-test. Due to the modular register approach, BIST techniques employing various embodiments of the invention can be used even for designs with many scan chains.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific implementations of the invention have been discussed with regard to logic built-in self-test techniques, it should be appreciated that implementations of the invention also may be employed with other types of built-in self-test techniques, such as memory built-in self-test (MBIST) techniques.

What is claimed is:

1. A method for testing an integrated circuit, comprising:
    programming a memory circuit to provide compressed restrict values during a test operation performed on the integrated circuit;
    decompressing the compressed restrict values to obtain restrict values;
    injecting the restrict values into a first pattern to form a second pattern; and
    shifting the second pattern into scan chains while the second pattern is being formed.

2. The method recited in claim 1, further comprising:
    programming the memory circuit to provide control information.

3. The method recited in claim 2, wherein:
    the control information includes information on how many shift cycles should be applied after a subset of the compressed restrict values are provided.

4. The method recited in claim 1, wherein:
    the compressed restrict values include parallel restrict data.

5. The method recited in claim 1, wherein:
    the compressed restrict values include serial restrict data.

6. The method recited in claim 1, wherein:
    the first pattern is generated by a linear finite state machine/phase shifter combination.

7. The method recited in claim 1, wherein:
    the compressed restrict values are generated based on identifying flip-flops of the scan chains that, for detecting a certain number of faults, are assigned specific values more than a predefined number of times.

8. A built-in self-test system in an integrated circuit device, comprising:
    a memory circuit configured to store compressed restrict values and address information;
    register circuitry configured to receive the compressed restrict values based on the address information;
    decompressors configured to decompress the compressed restrict values to form restrict values;

pattern generation circuitry configured to generate a first pattern;

bit-setting logic devices configured to insert the restrict values into the first pattern to form a second pattern; and scan chains configured for the second pattern to be shifted into while the second pattern is being formed.

9. The built-in self-test system recited in claim 8, further comprising:

a control circuit configured to control how many shift cycles should be applied after a subset of the compressed restrict values have been received by the register circuitry based on control information stored in the memory circuit.

10. The built-in self-test system recited in claim 8, wherein:

the register circuitry includes a register decoder configured to decode the address information and registers addressable by the register decoder to receive the compressed restrict values.

11. The built-in self-test system recited in claim 10, wherein:

the registers include parallel data registers.

12. The built-in self-test system recited in claim 10, wherein:

the registers include serial data registers.

13. The built-in self-test system recited in claim 8, wherein:

the pattern generation circuitry includes a linear finite state machine/phase shifter combination.

14. The built-in self-test system recited in claim 8, wherein:

the decompressors are XOR decompressors.

15. A built-in self-test system in an integrated circuit device, comprising:

means for storing compressed restrict values and address information;

means for receiving the compressed restrict values based on the address information;

means for decompressing the compressed restrict values to obtain restrict values;

means for generating a first pattern; and means for inserting the restrict values into the first pattern to form a second pattern.

16. The built-in self-test system recited in claim 15, wherein:

the compressed restrict values are obtained based on identifying flip-flops of the scan chains that, for detecting a certain number of faults, are assigned specific values more than a threshold number of times.

* * * * *